(12) United States Patent
Strickler et al.

(10) Patent No.: US 7,670,647 B2
(45) Date of Patent: Mar. 2, 2010

(54) METHOD FOR DEPOSITING ZINC OXIDE COATINGS ON FLAT GLASS

(75) Inventors: David A. Strickler, Toledo, OH (US);
Mark M. Hamilton, Toledo, OH (US);
Michael P. Remington, Jr., Toledo, OH (US)

(73) Assignees: Pilkington Group Limited, St. Helens, Merseyside (GB); Arkema, Inc., King of Prussia, PA (US)

( * ) Notice: Subject to any disclaimer, the term of this patent is extended or adjusted under 35 U.S.C. 154(b) by 449 days.

(21) Appl. No.: 11/800,040

(22) Filed: May 3, 2007

(65) Prior Publication Data

US 2007/0264507 A1 Nov. 15, 2007

Related U.S. Application Data

(60) Provisional application No. 60/798,461, filed on May 5, 2006, provisional application No. 60/840,895, filed on Aug. 29, 2006.

(51) Int. Cl.
*C23C 16/00* (2006.01)
*B32B 17/06* (2006.01)

(52) U.S. Cl. .................................. 427/255.33; 428/432

(58) Field of Classification Search ........................ None
See application file for complete search history.

(56) References Cited

U.S. PATENT DOCUMENTS 4,751,149 A 6/1988 Vijayakumar et al.

| | | |
|---|---|---|
| 6,071,561 A | 6/2000 | Gordon et al. |
| 6,416,814 B1 | 7/2002 | Giolando |
| 6,627,765 B2 | 9/2003 | Giolando |
| 2002/0117199 A1* | 8/2002 | Oswald ...................... 136/256 |
| 2003/0064231 A1* | 4/2003 | Hurst et al. ................. 428/432 |
| 2003/0185979 A1* | 10/2003 | Nelson .................... 427/248.1 |
| 2003/0215648 A1* | 11/2003 | Varanasi et al. ............. 428/432 |
| 2008/0170986 A1* | 7/2008 | Kitamura et al. ............ 423/700 |

FOREIGN PATENT DOCUMENTS

WO  WO 2005/072947 A1  8/2005
WO  WO 2007/029014 A1  3/2007

OTHER PUBLICATIONS

Smith, Frank T.J., "Metalorganic Chemical Vapor Deposition of Oriented ZnO Films Over Large Areas", Applied Physics Letters, vol. 43, No. 12 (1983) pp. 1108-1110.
Gerfin and Dahmen, CVD of NonMetals, (W.S. Rees, Jr., ed. VCH Publishers, Inc., New York, NY, 1996), Chaper 3, pp. 180-191.
Gulino, A., et al., "Synthesis and Characterization of Novel Self-Generating Liquid MOCVD Precursors for Thin Films of Zinc Oxide", Chemistry of Materials, vol. 12, No. 2, (2000) pp. 548-554.
Gulino, A., et al., "Deposition and Characterization of Transparent Thin Films of Zinc Doped with Bi and Sb", Chemistry of Materials, vol. 14, No. 1, (2002) pp. 116-121.

* cited by examiner

*Primary Examiner*—Timothy H Meeks
*Assistant Examiner*—Joseph Miller, Jr.
(74) *Attorney, Agent, or Firm*—Marshall & Melhorn, LLC

(57) ABSTRACT

A method of forming zinc oxide films on a heated, moving glass substrate utilizes a gaseous precursor mixture comprising an alkyl zinc compound chelated by at least one tridentate ligand, an oxygen-containing compound, and one or more inert carrier gases.

15 Claims, No Drawings

METHOD FOR DEPOSITING ZINC OXIDE COATINGS ON FLAT GLASS

RELATED APPLICATIONS

This application is claiming the benefit under 35 U.S.C. 119(e) of the provisional applications filed May 5, 2006 and Aug. 29, 2006 under 35 U.S.C. 111(b) which were granted Ser. Nos. 60/798,461 and 60/840,895, respectively. These provisional applications are each hereby incorporated by reference.

BACKGROUND OF THE INVENTION

This invention relates to a process for depositing zinc oxide films on a flat glass substrate.

Due to a number of desirable physical and chemical properties, zinc oxide coatings have been used previously, primarily in connection with UV lasers, piezoelectric devices, gas sensors and transparent conductors for solar cell contacts and flat panel displays.

Growth of zinc oxide coatings by CVD has been reported in the scientific literature. For example, Smith, Frank T. J., "Metalorganic chemical vapor deposition of oriented ZnO films over large areas", Applied Physics Letters, Vol. 43, No. 12 (1983) pg. 1108-1110, describes a metal organic chemical vapor deposition process for preparing c-axis-oriented ZnO films in a system similar to that which is commercially available for $SiO_2$ deposition. The resulting films are said to be highly uniform in thickness and to adhere to a variety of substrates.

Gerfin and Dahmen in *CVD of Nonmetals* (W. S. Rees, Jr. ed., VCH Publishers, Inc., New York, N.Y., 1996), chapter 3, pg. 180-185, describe the work of a number of researchers in use of a variety of chemical preparation techniques to form zinc oxide films. Use of dialkyl zinc compounds and various oxygen-containing compounds is discussed.

Gulino, A. et al., "Synthesis and Characterization of Novel Self-Generating Liquid MOCVD Precursors for Thin Films of Zinc Oxide", Chemistry of Materials, Vol. 12, No. 2 (2000) pg. 548-554, describes the production of $Zn(hfa)_2 \cdot 2H_2O$.polyether adducts and the use of same as precursor materials to form ZnO films on fused $SiO_2$ substrates. One such adduct is $Zn(hfa)_2 \cdot 2H_2O$.diglyme. Characterization of the adducts via spectroscopy and single crystal x-ray diffraction demonstrated that the polyether ligands were not ligated to the zinc center. ZnO films were said to be formed using such adduct in a low-pressure horizontal hot-wall reactor.

Deposition of zinc oxide films has also been described in the patent literature.

U.S. Pat. No. 4,751,149 to Vijaykumar, P., et al. describes a low temperature (200° C. or less) static deposition method for zinc oxide films, utilizing an organozinc compound and water carried in an inert gas. The resulting zinc oxide film is said to have a low resistivity which can be varied by addition of a Group XIII element.

U.S. Pat. No. 6,071,561 to Gordon, R., et al. describes deposition of fluorine-doped zinc oxide films utilizing a chelate of a dialkylzinc, such as an amine chelate, an oxygen source, and a fluorine source. The films produced are said to be highly electrically conductive, transparent to visible light, reflective to infrared radiation, absorbing to ultraviolet light, and free of carbon impurity.

U.S. Pat. No. 6,416,814 to Giolando, D. describes the use of ligated compounds of tin, titanium, and zinc as metal oxide precursor compounds in a method to produce high quality metal oxide coatings when coming in contact with a heated substrate.

U.S. Pat. No. 6,627,765 to Giolando D. describes ligated compounds of tin, titanium and zinc for use as metal oxide precursor compounds which are said not to be extremely reactive, yet maintain the ability to produce high quality metal oxide coatings when coming in contact with a heated substrate.

It would be desirable to form zinc oxide films at essentially atmospheric pressure and to produce them at deposition rates compatible with time-critical manufacturing processes, for example, production of flat glass by the well-known float method. Those skilled in the art have continued to search for a method of producing zinc oxide films meeting the above-noted criteria in order to have available affordable films for optical thin film stack designs.

SUMMARY OF THE INVENTION

In accordance with the present invention, there is provided a chemical vapor deposition process for forming a zinc oxide film on a heated glass substrate using a precursor gas mixture containing an alkyl zinc compound chelated by at least one tridentate ligand, an oxygen-containing compound and an inert carrier gas or a mixture of carrier gases.

Preferably, the present invention provides a process for depositing a zinc oxide film on a moving glass substrate heated to a temperature in the range of about 1050° F. (565° C.)-1400° F. (760° C.), utilizing a precursor gas mixture comprising an alkyl zinc compound chelated by at least one tridentate ligand, an oxygen-containing compound, and one or more inert carrier gases. The subject precursor gas mixture is maintained at a temperature below which the alkyl zinc complex reacts with the oxygen-containing compound, when such gaseous mixture is being delivered to a coating chamber, which opens onto the moving heated glass substrate.

DESCRIPTION OF THE PREFERRED EMBODIMENT

The present invention is, primarily, concerned with a method of forming a zinc oxide film on a rapidly moving, heated glass substrate at thicknesses which are useful for transparent conductors in photovoltic and flat panel display applications, solid state lighting (LEDs and OLEDs), touch panel screens, transparent thin film transistors (TFT) that have applications in RFID tags and integrated circuits, as well as low emissivity and solar control coating stacks. Preferably, the zinc oxide films of the present invention are formed on a heated glass ribbon in a float glass manufacturing process. Such films are often said to be formed "on-line" and the films themselves are often referred to as pyrolytic or "hard coat" films.

The zinc oxide films of the invention are formed from a novel combination of precursor constituents, which can generally be described as comprising an alkyl zinc compound chelated by at least one tridentate ligand and an oxygen-containing compound. An inert carrier gas or a mixture of carrier gases is also utilized in practicing the invention.

The alkyl zinc compound chelated by at least one tridentate ligand may comprise a dialkyl zinc glycol alkyl ether of the general formula: $R_2Zn \cdot [R"O(CH_2)_2O(CH_2)_2OR"]$, where R is a short chain, saturated organic group having 1 to 4 carbon atoms and R" is a short chain, saturated organic group having 1 to 4 carbon atoms. Preferably, R is an ethyl group ($C_2H_5$—)

and R" is a methyl group (CH₃—) and is referred to as diethylzinc (DEZ) diglyme having the formula:

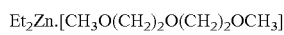

Dimethylzine diglyme Me₂Zn.[CH₃O(CH₂)₂O)CH₂)₂OCH₃] has also been found to be particularly useful in the context of the present invention.

Other tridentate ligands capable of chelating the dialkyl zinc moiety that may be useful in connection with the present invention include: compounds of the formula [RC(OR")₃] where R is H or a short chain, saturated organic group having 1 to 4 carbon atoms or a phenyl group and R" is a short chain, saturated organic group having 1 to 4 carbon atoms compound as described above, where R and R" may be the same or different, triamine ligands of the formula [R₂N(CH₂)₂N(R)(CH₂)₂NR₂] where R is a short chain, saturated organic group having 1 to 4 carbon atoms and compounds where R=a phenyl group (C₆H₅) or a substituted phenyl group. Diphenyl zinc compounds may also be useful in connection with the present invention.

While any suitable oxygen-containing compound may be utilized in connection with the present invention, nitrogen oxides such as NO and N₂O have been found to be particularly useful. Certain organic esters such as t-butyl acetate have been found to be particularly useful. Other oxygen-containing compounds that may be useful include SO₂, O₂, O₃, H₂O, alcohols and organic esters other than those already specifically noted.

A variety of known inert carrier gases may be utilized in connection with the above-described precursor compounds to form zinc oxide films, but helium and nitrogen, and mixtures thereof, are typically used.

It will be appreciated that one of the challenges of on-line coating is to produce films of useful thickness, having desired properties, in a matter of seconds, as the substrate moves beneath the gaseous precursor distribution system. Prior to the present invention, those skilled in the art have not been successful in meeting this challenge.

Dialkyl zinc compounds such as dimethyl and diethyl zinc are pyrophoric. By chelating the dialkyl zinc moiety the reactivity of such dialkyl zinc compounds towards moisture and oxygen is greatly attenuated and the complex is not pyrophoric and is much easier and safer to handle and utilize in large scale CVD processes than the parent dialkyl zinc compounds.

Previously reported dialkyl zinc chelates, such as those described by Gordon in U.S. Pat. No. 6,071,561, use bidentate ligands such as tetraethylethylenediamine (TEEDA), leaving two coordination sites open on the zinc center. Utilizing a tridentate ligand occupies one more coordination site on the zinc center thus attenuating the reaction with oxygen-containing compounds. The decreased reactivity towards oxygen-containing compounds leads to less pre-reaction and in turn more zinc compound can react at the substrate surface resulting in higher growth rates (vide infra).

The synthesis and isolation of the tridentate chelate complexes useful in the present invention will be straightforward to one skilled in the art. One such route includes slowly adding the dialkyl zinc reagent to a solution of the tridentate ligand in a 1:1 stoichiometry followed by appropriate separation steps to isolate the compound of interest. Once isolated, and if desired, purified by appropriate techniques (distillation etc.), one can spectrally characterize the compounds. Typical data (¹H NMR and IR) for the diethylzinc-diglyme complex is given below. ¹H NMR (C₆D₆, 399.78 MHz) δ 0.29 (q, ZnCH₂CH₃, 4H), 1.37 (t, ZnCH₂CH₃, 6H), 3.06 (s, O—(CH₂CH₂—O—CH₃)₂, 6H), 3.22 (t, O—(CH₂CH₂—O—CH₃)₂, 4H), 3.30 (t, O—(CH₂CH₂—O—CH₃)₂, 4H); IR (neat, cm⁻¹) 2985 vs(sh), 2852 vs(br), 1455 vs, 1350 s, 1244 s, 1200 vs, 1090 vs(br), 1019 vs, 986 s, 946 s, 866 vs.

Based on the chemical shifts and integration of the ¹H NMR signals, the compound is a 1:1 adduct between diethyl zinc and diglyme, Et₂Zn.[CH₃O(CH₂)₂O(CH₂)₂OCH₃]. Further support for the diglyme being ligated to the zinc center has been found in IR spectral data.

As previously noted, the method of the present invention is generally practiced in connection with the formation of a continuous glass ribbon substrate, for example during a float glass production process.

While it is contemplated that the precursor could be combined at, or very near, the surface of the glass, the present invention preferably involves the preparation of a precursor gas mixture which includes alkyl zinc compounds chelated by at least one tridentate ligand, particularly DEZ diglyme and an oxygen-containing compound, for example, NO, N₂O or highly branched acetates such as isopropyl acetate, sec-butyl acetate, and t-butyl acetate. A carrier gas or diluent, for example, nitrogen, air or helium, will normally also be included in the gas mixture.

The gaseous mixture is maintained at a temperature below that at which it reacts to form the zinc oxide, and is delivered to a location near a flat glass substrate to be coated, the substrate being at a temperature above the reaction temperature.

The precursor gas mixture is thereafter introduced into the vapor space directly over the substrate. The heat from the substrate raises the temperature of the precursor gas above the thermal decomposition temperature of the oxygen-containing compound. The oxygen-containing compound then reacts with the chelated alkyl zinc compound to produce a zinc oxide film on the substrate.

The present invention permits the production of zinc oxide films deposited on hot glass at a high deposition rate. Preferably, the zinc oxide coatings are deposited in accordance with the invention at a rate of over 200 Å/second, and more preferably the zinc oxide coatings are deposited at a rate of over 500 Å/second. High deposition rates are important when coating substrates in a manufacturing process. This is particularly true for an on-line float glass process where the glass ribbon is traveling at a specific line speed on the order of several hundred inches per minute, and where a specific coating thickness is required. The deposition rates obtained with the preferred embodiments of the present invention may be five or more times higher than the deposition rate with other known methods for depositing zinc oxide coatings. Especially high deposition rates for zinc oxide may be achieved with the present invention using a precursor mixture including DEZ diglyme and nitric oxide (NO), DEZ diglyme and t-butyl acetate, or dimethylzinc (DMZ) diglyme and t-butyl acetate.

For any particular combination of compounds, the optimum concentrations and flow rates for rapid coating deposition may be determined by simple trial. However, it will be appreciated that the use of higher concentrations of reactants and high gas flow rates is likely to result in a less efficient overall conversion of the reactants into a coating, so that the optimum condition for commercial operation may differ from the conditions which provide the highest deposition rates.

The method of the invention permits the production, at high rates, of zinc oxide films on hot flat glass substrates on line during the glass production process. The zinc oxide coatings produced by the inventive method have been found to have refractive index values in the range of 1.72-2.0, permitting the achievement of desired optical effects, especially when used in combination with other coating layers. The zinc oxide coatings may be doped, for example with aluminum, if desired. Such aluminum doping may affect certain optical constants of the coating and/or may impart certain properties to the outer surface of the coating, e.g., conductivity, IR reflectivity, etc.

A float glass installation may be utilized as a means for practicing the method of the present invention. The float glass installation described herein is illustrative of such installations, and is not limiting as to the invention.

The float glass apparatus more particularly comprises a canal section along which molten glass is delivered from a melting furnace, to a float bath section wherein a continuous glass ribbon is formed in accordance with the well-known float process. The glass ribbon advances from the bath section through an adjacent annealing lehr and a cooling section. The continuous glass ribbon serves as the substrate upon which the zinc oxide coating is deposited in accordance with the present invention.

The float section includes a bottom section within which a bath of molten tin is contained, a roof, opposite sidewalls, and end walls. The roof, sidewalls, and end walls together define an enclosure in which a non-oxidizing atmosphere is maintained to prevent oxidation of the molten tin.

In operation, the molten glass flows along the canal beneath a regulating tweel and downwardly onto the surface of the tin bath in controlled amounts. On the tin bath the molten glass spreads laterally under the influences of gravity and surface tension, as well as certain mechanical influences, and it is advanced across the bath to form the ribbon. The ribbon is removed over lift out rolls and is thereafter conveyed through the annealing lehr and the cooling section on aligned rolls. The application of the coating of the present invention may take place in the float bath section, or further along the production line, for example in the gap between the float bath and the annealing lehr, or in the annealing lehr.

A suitable non-oxidizing atmosphere, generally nitrogen or a mixture of nitrogen and hydrogen in which nitrogen predominates, is maintained in the bath enclosure to prevent oxidation of the tin bath. The atmosphere gas is admitted through conduits operably coupled to a distribution manifold. The non-oxidizing gas is introduced at a rate sufficient to compensate for normal losses and maintain a slight positive pressure, on the order of about 0.001 to about 0.01 atmosphere above ambient atmospheric pressure, so as to prevent infiltration of outside atmosphere. For purposes of the present invention the above-noted pressure range is considered to constitute normal atmospheric pressure. Heat for maintaining the desired temperature regime in the tin bath and the enclosure is provided by radiant heaters within the enclosure. The atmosphere within the lehr is typically atmospheric air, as the cooling section is not enclosed and the glass ribbon is open to the ambient atmosphere. Ambient air may be directed against the glass ribbon as by fans in the cooling section. Heaters may also be provided within the annealing lehr for causing the temperature of the glass ribbon to be gradually reduced in accordance with a predetermined regime as it is conveyed therethrough.

Gas distributor beams are generally positioned in the float bath to deposit the various coatings on the glass ribbon substrate. The gas distributor beam is one form of reactor that can be employed in practicing the process of the present invention. A suitable gas distributor beam is described in U.S. Pat. No. 4,922,853 which is herein incorporated by reference.

A conventional configuration for the distributor beams suitable for supplying the precursor materials in accordance with the invention is generally an inverted generally channel-shaped framework formed by spaced inner and outer walls and defines enclosed cavities. A suitable heat exchange medium is circulated through the enclosed cavities in order to maintain the distributor beams at a desired temperature.

The precursor gas mixture is supplied through a fluid cooled supply conduit. The supply conduit extends along the distributor beam and admits the gas through drop lines spaced along the supply conduit. The supply conduit leads to a delivery chamber within a header carried by the framework. Precursor gases admitted through the drop lines are discharged from the delivery chamber through a passageway toward a coating chamber defining a vapor space opening onto the glass where they flow along the surface of the glass.

Baffle plates may be provided within the delivery chamber for equalizing the flow of precursor materials across the distributor beam to assure that the materials are discharged against the glass in a smooth, laminar, uniform flow entirely across the distributor beam. Spent precursor materials are collected and removed through exhaust chambers along the sides of the distributor beam.

Various forms of distributor beams used for chemical vapor deposition are suitable for the present method and are known in the prior art.

The following examples (in which gas volumes are expressed under standard conditions, i.e., one atmosphere pressure and ambient temperature, unless otherwise stated) which constitute the best mode presently contemplated by the inventors for practicing the invention, are presented solely for the purpose of further illustrating and disclosing the present invention, and are not to be construed as a limitation on the invention:

EXAMPLES

Examples 1-9

The following experimental conditions are applicable to Examples 1-9.

A laboratory furnace having a moving conveyor to move a glass sheet, or sheets, through said furnace at a rate of 125 inches/minute (ipm), also contains a single, 10-inch wide, bi-directional coater, the coater being suitable for conveying vaporized reactants to the surface of the glass sheets in order to form a film or film stack by chemical vapor deposition.

The glass sheets were heated to approximately 1170° F. (632° C.), while the coater, at the reactor face, i.e., the portion nearest the glass surface is at a temperature of approximately 400° F. (204° C.).

Total gas flow was essentially 27-28 standard liters per minute (slm).

Preparation of the Various Precursor Materials was Accomplished by Utilizing a source chamber known as "a bubbler". The bubbler was maintained at a temperature of 212° F. (100° C.). Helium gas was introduced into the bubbler, at a particular flow rate of 1.4 slm. Alternatively, the precursors could have been delivered using one or more heated thin film evaporators, such as that shown in U.S. Pat. No. 5,090,985 or 6,827,974, each incorporated herein by reference.

Table 1 summarizes the deposition conditions and the resulting film thickness for the examples. Film thickness was determined by chemically etching the sample and step profiling. The alkyl zinc compound chelated by at least one tridentate ligand was DEZ diglyme. The oxygen-containing compound was $N_2O$ for Examples 1, 3, 5 and 6, and NO for Examples 2, 4 and 7-9.

TABLE 1

| Example | Oxidant | Volume % Oxidant | Thickness (Å) | Growth rate (Å/s) |
|---|---|---|---|---|
| 1 | $N_2O$ | 54 | 1150 | 171 |
| 2 | NO | 7 | 1170 | 174 |
| 3 | $N_2O$ | 73 | 1660 | 247 |
| 4 | NO | 22 | 449 | 67 |
| 5 | $N_2O$ | 55 | 1752 | 261 |
| 6 | $N_2O$ | 73 | 1515 | 225 |
| 7 | NO | 36 | 505 | 75 |
| 8 | NO | 4 | 1009 | 150 |
| 9 | NO | 9 | 504 | 75 |

The various reactants described above were combined in the coater to deposit a zinc oxide coating on a clear soda-lime-silica glass sheet whereon a $SiO_2$ layer 150 Å thick had previously been deposited.

As can be seen from the information presented in Table 1, the combination of DEZ diglyme and either NO or $N_2O$ without other reactive constituents, when combined and deposited in the manner described herein, forms zinc oxide films at useful thicknesses due to very satisfactory growth rates. Certain properties of Examples 1-3 and 9 were measured by UV-visible-NIR spectroscopy. The filmed glasses exhibited visible light transmittance of about 80%, reflection of visible light of between 15.3 and 18.9% and absorption of visible light in the range of 1.5-4.6%.

The following comparative examples demonstrate the previously discussed advantages of the alkyl zinc compound chelated by at least one tridentate ligand (DEZ diglyme) over the parent dialkyl zinc (DEZ) and an alkyl zinc compound chelated by a bidentate ligand (DEZ-TEEDA) for growing ZnO coatings under essentially identical growth conditions. The DEZ chelates were delivered to the coater using a thin film evaporator at a known liquid flow rate. DEZ was delivered using a bubbler at a known vapor pressure. The oxygen-containing compound used was nitric oxide (NO). The gas phase concentrations of the reactant gases for each experiment were essentially identical. Table 2 summarizes the results.

TABLE 2

| Comparative Example | Zn Source | Thickness (Å) | Growth Rate (Å/s) |
|---|---|---|---|
| 1 | DEZ | 1430 | 213 |
| 2 | DEZ-TEEDA | 1000 | 149 |
| 3 | DEZ diglyme | 1896 | 282 |

From the information displayed in Table 2, the advantages of DEZ diglyme are apparent. The use of the tridentate chelate of DEZ (DEZ diglyme) results in a growth rate approaching 2 times that for the bidentate chelate of DEZ (DEZ-TEEDA) under essentially identical growth conditions. Additionally, the growth rate using DEZ diglyme is 32% greater than DEZ under essentially identical growth conditions and has the added benefit of being easier and safer to handle than DEZ which is important for large scale CVD processes.

Further examples have demonstrated growth rates greater than 500 Å/s. For example a gaseous mixture of about 2% DEZ diglyme and about 7% NO resulted in ZnO coatings being deposited at about 583 Å/s. This rate approaches a deposition efficiency of 85% with respect to the zinc precursor.

Examples 10-13

Organic esters have been mentioned as suitable oxygen containing compounds for use in the invention. Highly branched acetates such as isopropyl acetate, sec-butyl acetate, and t-butyl acetate have been found to be most preferable. While not wishing to be bound by any theory, it is possible that this phenomenon is related to the number of β-hydrogens available on the acetate which facilitates decomposition and formation of proper reactive intermediates. The following Table 3 supports this hypothesis. Experimental growth conditions are essentially identical to those used in Examples 1-9. For each example the concentrations of DEZ diglyme and ester are essentially identical allowing for direct comparison of the effectiveness of a given acetate in the deposition of zinc oxide coatings at high growth rates. Higher branched acetates have a higher number of β-hydrogens and result in higher growth rates. Film thickness was determined by chemically etching the sample and step profiling.

TABLE 3

| Example | Acetate | β-hydrogens | Thickness | Rate (Å/s) |
|---|---|---|---|---|
| 10 | Ethyl | 3 | 1564 | 233 |
| 11 | n-butyl | 2 | 1554 | 231 |
| 12 | Sec-butyl | 5 | 2936 | 437 |
| 13 | Tert-butyl | 9 | 3732 | 555 |

Examples 14-22

The experimental growth conditions for Examples 14-22 were essentially identical to those used in Examples 1-9. Table 4 summarizes the deposition conditions and the resulting film thickness for the examples. Film thickness was determined by chemically etching the sample and step profiling. The alkyl zinc compound chelated by at least one tridentate ligand was DEZ diglyme. The oxygen-containing compound was t-butyl acetate.

TABLE 4

| Example | % t-butyl acetate | % DEZ diglyme | Thickness (Å) | Growth rate (Å/s) |
|---|---|---|---|---|
| 14 | 8.5 | 2.1 | 6353 | 945 |
| 15 | 12 | 2.1 | 5904 | 879 |
| 16 | 5 | 2.1 | 4442 | 661 |
| 17 | 5 | 1.3 | 3551 | 528 |
| 18 | 8.5 | 1.3 | 3484 | 518 |
| 19 | 5 | 1.3 | 3176 | 473 |
| 20 | 12 | 1.3 | 3108 | 462 |
| 21 | 5 | 3.4 | 4507 | 671 |
| 22 | 12 | 3.4 | 6543 | 974 |

The following comparative examples demonstrate the advantages of the alkyl zinc compound chelated by at least one tridentate ligand (DEZ diglyme) over the parent dialkyl zinc (DEZ) in the deposition reaction with a highly branched organic ester, t-butyl acetate (tBuOAc). DEZ diglyme was delivered to the coater using a thin film evaporator at a known liquid flow rate. DEZ was delivered using a bubbler at a known vapor pressure. The t-BuOAc was delivered using a bubbler at a known vapor pressure. Film thickness was determined by chemically etching the sample and step profiling. Table 5 summarizes the results.

TABLE 5

| Precursor | Zn conc. | tBuOAc conc. | Thickness | % Increase |
|---|---|---|---|---|
| DEZ | 1.3 | 8.5 | 2261 | 54 |
| DEZ-diglyme | | | 3484 | |
| DEZ | 2.1 | 12 | 2972 | 99 |
| DEZ-diglyme | | | 5904 | |
| DEZ | 3.4 | 5 | 2773 | 63 |
| DEZ-diglyme | | | 4507 | |

As can be established from Table 5, there is a clear advantage in utilizing a dialkyl zinc chelated by at least one tridentate ligand over the dialkyl zinc itself. Under our deposition conditions one is able to achieve a thickness increase of nearly two times that achieved using DEZ under essentially identical deposition conditions, by utilizing DEZ diglyme.

The uniform, gaseous reactant mixture which is delivered to the surface of the hot glass substrate in accordance with the invention preferably includes from about 0.5 to about 3.0 volume % alkyl zinc compound chelated by at least, one tridentate ligand, from about 3 to about 75 volume % of oxygen-containing compound, and from about 20 to about 95 volume % of one, or a mixture of two or more, inert carrier gases.

It has also been noted to be preferable, when forming the zinc oxide coating in accordance with this invention, to apply a layer of a material which acts as a sodium diffusion barrier between the glass substrate and the zinc oxide coating. Coated glass articles have generally been found to exhibit lower haze when the zinc oxide coating deposited in accordance with the invention is applied to the glass with a sodium diffusion layer therebetween, as opposed to directly on the glass. This sodium diffusion layer is preferably formed of silica. The layer of silica is preferably formed using conventional CVD techniques.

In a more preferred embodiment, a thin film of tin oxide is first deposited on the surface of the hot glass substrate, with a thin film of silica deposited thereover, so that an underlayer structure of tin oxide/silica is formed intermediate the glass and the subsequently deposited layer of zinc oxide. In this embodiment, the silica film not only acts as a sodium diffusion barrier but, in combination with the first (undoped) tin oxide film, helps to suppress iridescence in the resulting coated glass article. The use of such anti-iridescent layers is disclosed in U.S. Pat. No. 4,377,613, which is incorporated herein in its entirety by reference thereto.

It must be noted that the process conditions are not sharply critical for the successful combining and delivering of vaporized reactants according to the present invention. The process conditions described herein are generally disclosed in terms which are conventional to the practice of this invention. Occasionally, however, the process conditions as described may not be precisely applicable for each compound included within the disclosed scope. Those compounds for which this occurs will be readily recognizable by those ordinarily skilled in the art. In all such cases, either the process may be successfully performed by conventional modifications known to those ordinarily skilled in the art, e.g., by increasing or decreasing temperature conditions, by varying rates of combination of the reactants, by routine modifications of the vaporization process conditions, etc., or other process conditions which are otherwise conventional will be applicable to the practice of the invention.

It will also be noted that the process of the invention may be repeated as desired on a given substrate so as to form a coating consisting of several successive layers, the composition of each layer not necessarily being identical. It is, of course, obvious that for a given flow rate of the reactants, the thickness of a coating layer depends on the rate of movement of the substrate. Under these conditions, the reaction stations may, if desired, be multiplied by juxtaposing two or more coating devices. In this way, successive layers are superimposed before the layers have had time to cool, producing a particularly homogeneous overall coating.

The invention has been disclosed in which is considered to be its preferred embodiment. It must be understood, however, the specific embodiments are provided only for the purpose of illustration, and that the invention may be practiced otherwise than as specifically illustrated without departing from its spirit and scope.

What is claimed is:

1. A method of forming a zinc oxide film comprising:
providing a moving, hot glass substrate;
preparing a precursor gas mixture comprising an alkyl zinc compound chelated by at least one tridentate ligand, an oxygen-containing compound, and an inert carrier gas;
maintaining the precursor gas mixture at a temperature below the temperature at which the alkyl zinc compound reacts with the oxygen-containing compound to form a zinc oxide film while delivering the gaseous mixture to a coating chamber which opens onto the hot glass substrate; and
introducing the precursor gas mixture into the coating chamber and directing the mixture to a surface of the heated glass substrate, whereby the gaseous mixture is heated to above the reaction temperature of the alkyl zinc compound and the oxygen-containing compound to cause the deposition of the zinc oxide film on the surface of the heated glass substrate,
wherein the alkyl zinc compound chelated by at least one tridentate ligand comprises a dialkyl zinc glycol alkyl ether.

2. The method of forming a zinc oxide film defined in claim 1, wherein the moving glass substrate is a float glass ribbon.

3. The method of forming a zinc oxide film defined in claim 1, wherein the float glass ribbon is at a temperature in the range of about 1050° F.-1400° F./565° C.-760° C.

4. The method of forming a zinc oxide film defined in claim 1, wherein the dialkyl zinc glycol alkyl ether is diethyl zinc diglyme $Et_2Zn.[CH_3O(CH_2)_2O(CH_2)_2OCH_3]$.

5. The method of forming a zinc oxide film defined in claim 1, wherein the dialkyl zinc glycol alkyl ether is dimethyl zinc diglyme $Me_2Zn.[CH_3O(CH_2)_2O—(CH_2)_2OCH_3]$.

6. The method of forming a zinc oxide film defined in claim 1, wherein the oxygen-containing compound comprises a nitrogen oxide compound.

7. The method of forming a zinc oxide film defined in claim 6, wherein the oxygen-containing compound comprises one chosen from the group consisting of NO and $N_2O$.

8. The method of forming a zinc oxide film defined in claim 2, wherein the precursor gas mixture flows over the float glass ribbon to be coated under laminar flow conditions.

9. The method of forming a zinc oxide film defined in claim 1, wherein the moving glass substrate has a silica film thereon, and the zinc oxide film is deposited over the silica film.

10. The method of forming a zinc oxide film defined in claim 1, wherein an iridescence suppressing interlayer is formed on the moving glass substrate, and the zinc oxide film is deposited over the iridescence suppressing interlayer.

11. The method of forming a zinc oxide film defined in claim 10, wherein the iridescence suppressing interlayer comprises one chosen from the group consisting of a single layer, multi-layer and gradient layer iridescence suppressing interlayer.

12. The method of forming a zinc oxide film defined in claim 11, wherein the multi-layer iridescence suppressing interlayer comprises a tin oxide layer and a silica layer.

13. The method of forming the zinc oxide film defined in claim 1, wherein the glass substrate is moving at a rate of 125 ipm to 600 ipm as the zinc oxide film is deposited.

14. The method of forming the zinc oxide film defined in claim, wherein the thickness of the zinc oxide film formed is between 300 Å and 6500 Å.

15. The method of forming the zinc oxide film defined in claim 1, wherein the growth rate of the zinc oxide film formed is greater than 170 Å/sec.

* * * * *